US008145363B2

United States Patent
Bean, Jr. et al.

(10) Patent No.: US 8,145,363 B2
(45) Date of Patent: Mar. 27, 2012

(54) SYSTEMS AND METHODS FOR CONTROLLING LOAD DYNAMICS IN A PUMPED REFRIGERANT COOLING SYSTEM

(75) Inventors: John H. Bean, Jr., Wentzville, MO (US); James Richard Roesch, St. Charles, MO (US); Zhihai Gordon Dong, Chesterfield, MO (US); Stuart Lee Dill, St. Louis, MO (US)

(73) Assignee: American Power Conversion Corporation, West Kingston, RI (US)

( * ) Notice: Subject to any disclaimer, the term of this patent is extended or adjusted under 35 U.S.C. 154(b) by 356 days.

(21) Appl. No.: 12/474,083

(22) Filed: May 28, 2009

(65) Prior Publication Data

US 2010/0305775 A1    Dec. 2, 2010

(51) Int. Cl.
*G05D 23/00* (2006.01)
*G01M 1/38* (2006.01)
*G05B 13/00* (2006.01)
*G05B 15/00* (2006.01)

(52) U.S. Cl. ........ 700/300; 700/276; 700/277; 700/278; 700/299; 162/118; 162/129; 162/132; 162/186; 312/236; 165/97; 165/121; 165/122; 165/207

(58) Field of Classification Search .......... 700/276–278, 700/299–300; 162/118–120, 129, 132, 186; 312/236; 165/97, 121–123, 207

See application file for complete search history.

(56) References Cited

U.S. PATENT DOCUMENTS

| | | | |
|---|---|---|---|
| 5,465,588 A * | 11/1995 | McCahill et al. | 62/127 |
| 5,684,463 A * | 11/1997 | Diercks et al. | 340/584 |
| 5,749,243 A * | 5/1998 | Lester | 62/434 |
| 5,946,926 A * | 9/1999 | Hartman | 62/201 |
| 6,859,366 B2 | 2/2005 | Fink | |

(Continued)

FOREIGN PATENT DOCUMENTS

WO    2009/014893 A1    1/2009

OTHER PUBLICATIONS

International Search Report for PCT/US2010/035089 mailed Jul. 26, 2010.

*Primary Examiner* — Ramesh Patel
(74) *Attorney, Agent, or Firm* — Lando & Anastasi, LLP

(57) ABSTRACT

A pumped refrigerant cooling system for use in a row of equipment racks is configured to contain electronic equipment. The system includes a communication network and a refrigerant distribution unit in fluid communication with a chilled refrigerant supply and a heated refrigerant return. A cooling module is in fluid communication with the refrigerant distribution unit by a supply line and a return line. The cooling module is coupled to the communication network, and includes an evaporator and a fan configured to direct air over the evaporator. A sensor package is configured to monitor temperature and pressure reference points provided in the pumped refrigerant cooling system and the equipment racks. The system further includes a controller forming part of the cooling module and coupled to the communication network and the sensor package. The controller, based on information obtained from the sensor package, is configured to manipulate the flow of refrigerant through the evaporator by controlling the delivery of refrigerant to the evaporator and is configured to manipulate the flow of air over the evaporator by controlling the speed of the fan.

20 Claims, 8 Drawing Sheets

U.S. PATENT DOCUMENTS

| | | | |
|---|---|---|---|
| 6,967,283 B2 | 11/2005 | Rasmussen et al. | |
| 7,046,514 B2 * | 5/2006 | Fink et al. | 361/695 |
| 7,293,666 B2 | 11/2007 | Mattlin et al. | |
| 7,365,973 B2 * | 4/2008 | Rasmussen et al. | 361/694 |
| 7,450,385 B1 * | 11/2008 | Campbell et al. | 361/699 |
| 7,511,960 B2 * | 3/2009 | Hillis et al. | 361/702 |
| 7,864,527 B1 * | 1/2011 | Whitted | 361/696 |
| 2007/0163748 A1 * | 7/2007 | Rasmussen et al. | 165/53 |
| 2007/0167125 A1 * | 7/2007 | Rasmussen et al. | 454/184 |
| 2008/0041077 A1 * | 2/2008 | Tutunoglu | 62/186 |
| 2008/0245083 A1 * | 10/2008 | Tutunoglu et al. | 62/115 |
| 2009/0030554 A1 * | 1/2009 | Bean et al. | 700/276 |
| 2009/0168345 A1 * | 7/2009 | Martini | 361/691 |
| 2010/0300129 A1 * | 12/2010 | Bean et al. | 62/129 |

* cited by examiner

SYSTEMS AND METHODS FOR CONTROLLING LOAD DYNAMICS IN A PUMPED REFRIGERANT COOLING SYSTEM

BACKGROUND OF DISCLOSURE

1. Field of Disclosure

Embodiments of the disclosure relate generally to systems and methods for cooling a room, such as a data center, equipment room or wiring closet, and more specifically to systems and methods for controlling load dynamics in a pumped refrigerant cooling system that provides cooling to data centers and the like.

2. Discussion of Related Art

Equipment enclosures or racks for housing electronic equipment, such as data processing, networking and telecommunications equipment, have been used for many years. Such racks are often used to contain and to arrange the equipment in large equipment rooms and data centers. Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep, and is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by a data center's cooling system with computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

In other embodiments, the CRAC units may be modular and scalable so that the units may be placed anywhere within the data center depending on the cooling requirements within the data center. Such cooling units are described in pending U.S. patent application Ser. No. 11/335,874, entitled COOLING SYSTEM AND METHOD, filed on Jan. 19, 2006.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, air flow requirements can vary considerably as a result of different numbers and types of rack-mounted components and different configurations of racks and enclosures.

In other embodiments, in order to control the flow of air throughout the data center, and to optimize the air flow as described above, it may be desirable to contain and cool the air within the hot and cold aisles, and in particular, the hot aisle. Examples of such a hot aisle air containment system may be found in U.S. Pat. Nos. 6,859,366 and 7,046,514. Other examples of hot aisle containment systems are provided by American Power Conversion Corporation of West Kingston, R.I., the assignee of the present disclosure, under model nos. ACDC1014, ACDC1015, ACDC1018 and ACDC1019.

In hot aisle/cold aisle configurations ("HA/HC") and in hot aisle containment system configurations ("HACS"), it may be desirable to employ a modular cooling unit. With such cooling units, it is desirable to adjust the cooling capacity of the cooling unit so that the cooling capacity matches the heat generated by the load. Current approaches do not provide any means to adjust the cooling capacity of the cooling unit.

SUMMARY OF DISCLOSURE

One aspect of the disclosure is directed to a pumped refrigerant cooling system for use in a row of equipment racks configured to contain electronic equipment. In one embodiment, the pumped refrigerant cooling system comprises a communication network and a refrigerant distribution unit in fluid communication with a chilled refrigerant supply and a heated refrigerant return. The refrigerant distribution unit is coupled to the communication network. At least one cooling module is in fluid communication with the refrigerant distribution unit by a supply line and a return line. The cooling module is coupled to the communication network, and includes an evaporator and at least one fan configured to direct air over the evaporator. A sensor package is coupled to the communication network. The sensor package is configured to monitor temperature and pressure reference points provided in the pumped refrigerant cooling system and the equipment racks. The pumped refrigerant cooling system further comprises a controller forming part of the cooling module and coupled to the communication network and the sensor package. The controller, based on information obtained from the sensor package, is configured to manipulate the flow of refrigerant through the evaporator by controlling the delivery of refrigerant to the evaporator and is configured to manipulate the flow of air over the evaporator by controlling the speed of the fan.

Embodiments of the system include configuring the sensor package to obtain information directed to a saturation temperature. The sensor package includes a supply air temperature sensor and an evaporator pressure sensor. The cooling module further includes a pressure regulating valve disposed in the return line between the evaporator and the refrigerant distribution unit. The controller, based on the information directed to the saturation temperature, is configured to open and close the pressure regulating valve to achieve a preset saturation temperature of the cooling module. The cooling module further includes an expansion valve disposed in the supply line between refrigerant distribution unit and the evaporator. The expansion valve is being configured to meter mass flow of refrigerant into the evaporator. The controller is configured to manipulate the flow of refrigerant entering the evaporator by controlling the operation of the expansion valve. The arrangement is such that the controller manipulates the expansion valve to regulate refrigerant mass flow to the evaporator so that the refrigerant mass flow coincides with a thermal demand of the evaporator so as to assure complete evaporation of the refrigerant before exiting the evaporator. The sensor package includes a pressure sensor located immediately before the expansion valve. The sensor package includes a pressure sensor positioned to sense the pressure of evaporating refrigerant within the evaporator. The controller is configured to calculate cooling demand of the evaporator of the cooling module and established a refrigerant mass flow requirement to support a needed cooling demand of the evaporator. The controller is configured to anticipate an evaporating temperature necessary to satisfy a desired cooled air temperature leaving the evaporator and a corresponding saturation pressure of the refrigerant entering within the evaporator. The controller is configured to determine a position of an electronic expansion valve of the cooling module, the electronic expansion valve being disposed in the supply line between refrigerant distribution unit and the evaporator, the electronic expansion valve being configured to meter mass flow of refrigerant into the evaporator based on needed mass flow, valve flow characteristics and/or a pressure differential between refrigerant supply pressure and anticipated evaporating pressure. The cooling module further includes an electronic evaporator pressure regulating valve disposed in the return line between the evaporator and the refrigerant distribution unit. The electronic evaporator pressure regulating valve is configured to regulate evaporator pressure to maintain a desired cooled air exit temperature from evaporator. The controller of the cooling module further includes a PID loop that regulates the electronic evaporator pressure regulating valve position as needed to maintain a predetermined saturated evaporating temperature. The controller is configured to allow multiple groups of evaporators of cooling modules to share a common communications network while enabling an association of evaporators to specific groups of cooling modules to aggregate and synchronize with other members of the same group. The communication network communicates with a plurality of evaporators to enable each an aggregation of collective total cooling demand and equal sharing of the cooling demand across the various member evaporators of the particular communications network.

Another aspect of the disclosure is directed to a method of controlling an operation of a pumped refrigerant cooling system for use in a data center having one or more rows of equipment racks. Each equipment rack is configured to contain electronic equipment. In one embodiment, the method comprises: determining a configuration of the one or more rows of equipment racks within the data center; maintaining a constant supply air temperature for air entering into the equipment racks within the one or more rows of equipment racks; and maintaining a constant temperature differential between the supply air temperature and air entering one or more cooling modules of the pumped refrigerant cooling system.

Embodiments of the method include, when maintaining a constant supply air temperature, obtaining a supply air temperature of air entering the equipment rack and controlling the supply air temperature. Maintaining a constant temperature differential includes estimating an actual air flow within the cooling module and controlling at least one fan in the cooling module based on a required cooling capacity used to obtain the constant temperature differential. The method may further comprise manipulating a flow of refrigerant entering an evaporator of the cooling module by controlling the operation of an expansion valve so that a refrigerant mass flow coincides with a thermal demand of the evaporator so as to assure complete evaporation of refrigerant before exiting the evaporator. The method may further comprise calculating cooling demand of an evaporator of the cooling module and establishing a refrigerant mass flow requirement to support a needed cooling demand of the evaporator. The method may further comprise calculating an evaporating temperature necessary to satisfy a desired cooled air temperature leaving an evaporator of the cooling module and a corresponding saturation pressure of the refrigerant entering the evaporator of the cooling module. The method may further comprise determining a position of an electronic expansion valve of the cooling module. The electronic expansion valve is disposed in a supply line delivering refrigerant to an evaporator of the cooling module. The electronic expansion valve is configured to meter mass flow of refrigerant into the evaporator based on needed mass flow, valve flow characteristics and/or pressure differential between refrigerant supply pressure and anticipated evaporating pressure. The method may further comprise regulating an electronic evaporator pressure regulating valve position as needed to maintain a predetermined saturated evaporating temperature. The method may further comprise allowing multiple groups of evaporators of cooling modules to share a common communications network while enabling an association of evaporators to specific groups of cooling modules to aggregate and synchronize with other members of the same group.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
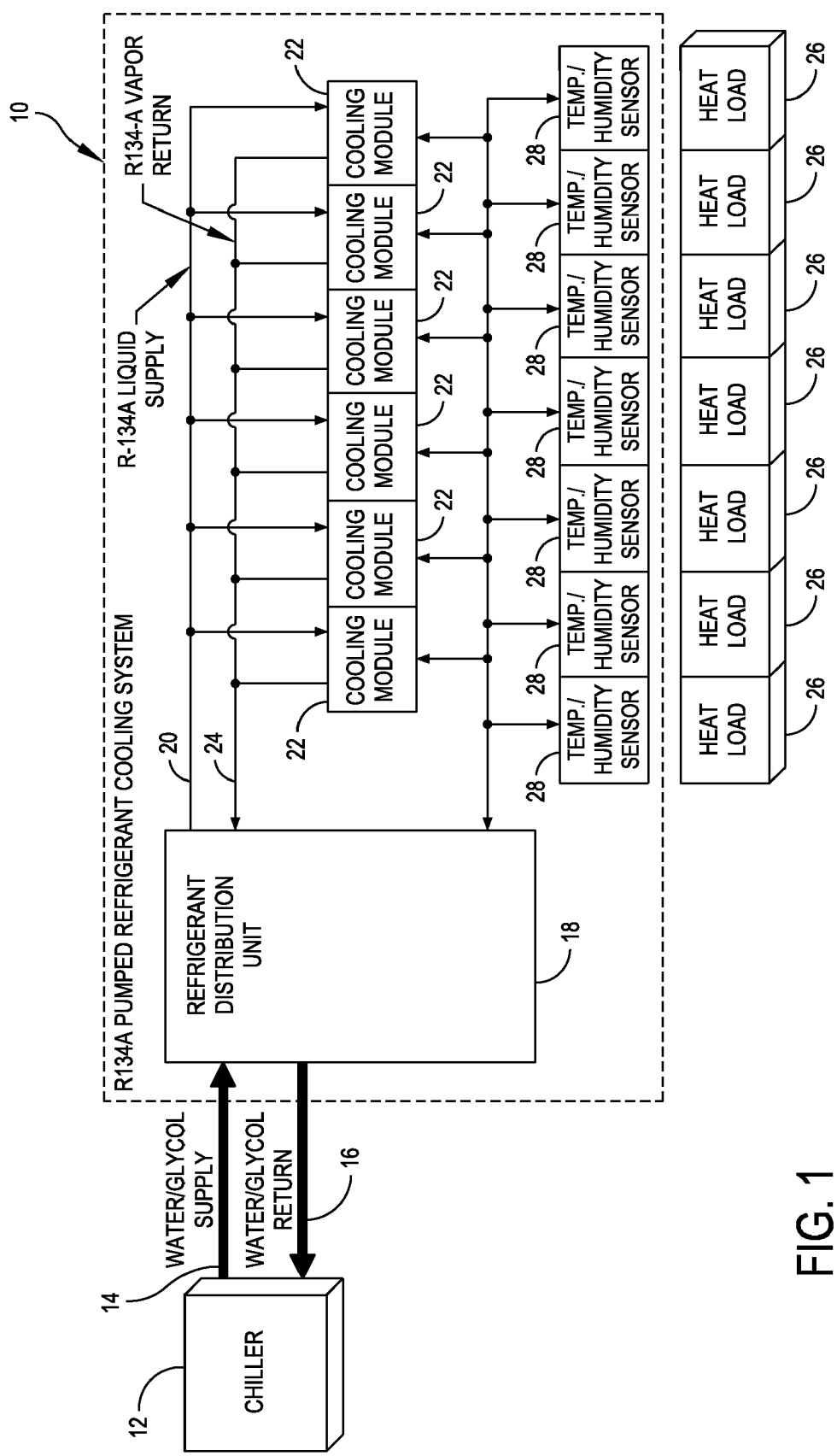
FIG. 1 is a block diagram of a cooling system of an embodiment of the disclosure.

This disclosure is not limited in its application to the details of construction and the arrangement of components set forth in the following description or illustrated in the drawings. The concepts described in this disclosure are capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

At least one embodiment of the present disclosure is directed to a cooling system that is configurable to cool electronic equipment housed within equipment enclosures or racks of a data center. As used herein, "enclosures" and "racks" are used to describe apparatus designed to support electronic equipment. Such a cooling system may embody one or more cooling units on an as needed basis to provide localized cooling within the data center. In one embodiment, multiple cooling units may be interspersed in a row of equipment racks to more efficiently cool the data center. In another embodiment, a hot aisle containment system may be employed to capture and treat hot air contained within the hot aisle. With either approach, the circulation path of warm air generated by the electronic equipment is reduced so as to reduce the mixing of hot and cold air within the data center.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling system is modular and scalable, and may take the form of a kit designed to meet these changing needs. Also, although relatively large data centers are discussed as an intended use for such a cooling system, as mentioned above, the system is scalable and may be employed in smaller rooms on a smaller scale and for applications other than data center.

In one embodiment, the cooling system may comprise a plurality of cooling units, each cooling unit having a housing adapted to support components of the cooling system. For example, the components of the cooling unit may include one or more heat exchangers coupled to a conduit system configured to deliver coolant to the heat exchangers. Fans may be provided to move air across the heat exchangers. Such a cooling unit may be referred to as a pumped refrigerant cooling system or PRCS. The cooling unit may be disposed within a row of equipment racks and configured to intake the hot air within the data center from a hot aisle, for example, to cool the air to slightly below ambient temperature. This configuration eliminates the inefficiency of mixing hot air with the room temperature air to obtain a warm air mixture. This configuration may also decrease the latent cooling provided by the data center's air conditioning system thereby decreasing the need for humidification.

In certain embodiments, the components of the cooling unit may be provided in kit form so that the person installing the cooling unit does not require specialized tools. The modular nature of the cooling unit allows the user to optimize the location of each cooling unit since each cooling unit includes the ability to sense and display the capacity of the system, the flow rate, coolant and air inlet and outlet temperatures, and pressure differentials obtained from pressure readings taken throughout the cooling unit. Thus, the cooling unit may be employed and redeployed for maximum efficiency and optimal use within the data center.

A typical data center includes a room designed to house a plurality of equipment racks. In one embodiment, each equipment rack may be constructed in accordance with the teachings disclosed in U.S. patent application Ser. No. 10/990,927, entitled EQUIPMENT ENCLOSURE KIT AND ASSEMBLY METHOD, filed on Nov. 17, 2004, which is owned by the assignee of the present disclosure and is incorporated herein by reference. Further, cabling between the equipment racks may be implemented using cable distribution troughs contained on the roofs of the racks as disclosed in U.S. Pat. No. 6,967,283, which is incorporated herein by reference and assigned to the assignee of the present disclosure.

Specifically, the equipment rack includes a frame or housing adapted to support electronic components, such as data processing, networking and telecommunications equipment. The housing includes front, back, sides, bottom and top. The front of each equipment rack may include a front door so as to enable access into the interior of the equipment rack. A lock may be provided to prevent access into the interior of the equipment rack and the equipment housed by the rack. The sides of the equipment rack may include at least one panel configured to cover a side to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. Otherwise, the panels may be fabricated from solid material.

The equipment racks are modular in construction and configured to be rolled into and out of position, e.g., within a row of the data center. Casters are secured to the bottom of each equipment rack to enable the rack to roll along the floor of the data center. Once positioned, leveling feet may be deployed to securely ground the equipment rack in place within the row. An example of casters and leveling feet employed on such an equipment rack is disclosed in detail in U.S. patent application Ser. No. 10/990,927.

Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof" as described in U.S. Pat. No. 6,967,283) at the top of the equipment rack having openings formed therein or through an open top of the equipment rack. In this embodiment, the cables may be strung along the roofs of the rack or be provided in the aforementioned cable distribution trough. In another embodiment, the cables may be disposed within a raised floor and connected to the electronic equipment through the bottom of the equipment rack. With both configurations, power and communication lines are provided to the equipment racks.

As discussed above, data centers are typically configured with rows of equipment racks arranged such that cool air is drawn into the racks from a cool aisle and warm or hot air is exhausted from the racks into a hot aisle. The equipment racks may be arranged in two rows with the fronts of the equipment racks in a near row being arranged in a forward direction and the backs of the equipment racks in a far row being arranged in a rearward direction. However, as stated above, in a typical data center, there are multiple rows of equipment racks wherein the rows may be arranged with the fronts of the equipment racks facing one another to define the cold aisle and with the backs of the equipment racks facing one another to define the hot aisle. In order to address the heat build-up and hot spots within the data center, and to address climate control issues within the data center in general, modular cooling units are provided. In one configuration, the arrangement is such that cooling units are disposed within the rows of equipment racks in which there is a cooling unit for every two equipment racks provided in the data center. However, more or less cooling units may be provided within the data center based on environmental conditions of the data center. Further, in some embodiments, the concentration and locations of cooling units may be adjusted based on the locations of the hottest racks in the data center, or based on information obtained and analyzed by a data center information management system. Additionally, cooling units may be used in combination with other types of cooling systems, such as cooling systems of the types disclosed in U.S. patent application Ser. Nos. 11/335,874, 11/335,856 and 11/335,901, each entitled COOLING SYSTEM AND METHOD and filed on Feb. 10, 2006, which are owned by the assignee of the present disclosure and incorporated herein by reference.

In one embodiment, a controller is adapted to control the operation of the cooling system based on environmental parameters obtained by the controller. Generally speaking, with prior cooling systems, the individual cooling units can not communicate with one another. For example, the controller may embody a plurality of controllers provided in the cooling units that communicate with one another over a controller area network (CAN) Bus. In other embodiments, a master controller may be provided to control the operation of the controllers of the cooling units. Each cooling unit may be provided with a display, which is operably coupled to the controller. The display is adapted to display the environmental conditions of the data room, such as, and not limited to, the temperature and the humidity of the data center at the cooling unit, the temperature of the air entering into and exiting out of the cooling unit, the temperature of coolant entering into and exiting out of the cooling unit, the flow rate of coolant entering the cooling unit, and the cooling capacity of the cooling unit. Suitable monitors, sensors and/or gauges may be provided to acquire such information. Alternatively, or in addition to the foregoing embodiment, the environmental conditions may be displayed on a unit provided with an integrated data center control and monitoring system.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks.

Other embodiments of an air containment cooling system of the disclosure may include an air containment cooling system for containing and cooling air between two rows of equipment racks. In one embodiment, the air containment cooling includes a canopy assembly configured to enclose a hot aisle defined by the two rows of equipment racks. The air containment cooling system further includes a cooling system embedded within the canopy assembly. In a certain embodiment, the cooling system is configured to cool air disposed within the hot aisle. A bus may be provided that extends horizontally along the hot aisle. Embodiments of the bus may include one of a power distribution bus, a cable management bus, and a cooling bus, with the bus defining a side of the canopy assembly.

In other embodiments, the canopy assembly may include a frame structure having a plurality of vertical and horizontal support members, and at least one cooling panel configured to be supported by the frame structure. The cooling panel may be configured to enclose and contain air within the hot aisle.

Embodiments of the cooling system may include disposing a heat exchanger within the cooling panel. To deliver coolant to the heat exchanger, pipes may be disposed within the plurality of vertical and horizontal support members. A fan, supported by the frame structure, may be provided to direct air toward the heat exchanger. In a certain embodiment, the heat exchanger includes a coil.

The air containment cooling system of embodiments disclosed herein may be configured to be a free-standing docking station for equipment racks that contain equipment, such as information technology equipment. The system is specifically configured to support all of the necessary data center needs, including equipment requirements, power needs, cable management needs and cooling requirements. In one embodiment, the system may be designed to support an average of 20 kW per equipment rack requirement.

The system may be designed to receive equipment racks that are docked within open slots along a hot aisle docking station formed by the system, thereby eliminating the need of determining whether the space provided is suitable for the needs of the particular equipment rack. As mentioned above, power distribution, cable management, and air containment and cooling are integrated within the system. Thus, field installation of equipment racks within the data center is greatly simplified. The system of embodiments of the disclosure enables the provision of one integrated solution that has been heretofore addressed separately by addressing rack, cooling, power and cable management requirements individually.

In certain embodiments, a modular pumped refrigerant cooling system includes a single or multiple cooling modules, which may be connected to a central refrigerant distribution unit. The system is configured in such a manner that a saturated condensing temperature is below a saturate evaporating temperature and the vapor is pulled back to the cooling module by a pressure differential associated with the different saturation temperatures. In certain embodiments, the modular pumped refrigerant cooling system includes single or multiple evaporators contained within each cooling module, with each evaporator being provided with an electronic expansion valve used to meter mass flow of refrigerant and an outlet evaporator pressure regulating valve used to directly regulate evaporator temperature. One or more fans are provided to direct air to be cooled over the evaporator. Thus, the supply air temperature of the gas (e.g., air) to be cooled is indirectly regulated as the air traverses the evaporator's surface. The system further includes a sensor package having a plurality of pressure sensors, which are used to directly measure the refrigerant pressure of each evaporator and the refrigerant pressure at the inlet of each electronically controlled expansion valve. The sensor package further has a plurality of temperature sensors on both the entering and leaving side of the evaporator that sense the temperature of the air to be cooled before the evaporator and the temperature of the now cooled air as it leaves the evaporator.

A communication network provides communication between the cooling modules, the sensor package, and a controller, which is also coupled to the cooling module. The controller, based on information obtained from the sensor package, is configured to manipulate the flow of refrigerant through the evaporator by controlling the delivery of refrigerant to the evaporator and is configured to manipulate the flow of air over the evaporator by controlling the speed of the fan. Specifically, the controller is configured to open and close the pressure regulating valve to achieve a preset saturation temperature of the cooling module. The controller is further configured to manipulate the flow of refrigerant entering the evaporator by controlling the operation of the expansion valve. The arrangement is such that the controller manipulates the expansion valve to regulate refrigerant mass flow to the evaporator so that it coincides with a thermal demand of the evaporator so as to assure complete evaporation of the refrigerant before exiting the evaporator.

In some embodiments, the controller is configured to calculate cooling demand of the evaporator of the cooling module and established a refrigerant mass flow requirement to support a needed cooling demand of the evaporator. The controller is configured to anticipate an evaporating temperature necessary to satisfy desired cooled air temperature leaving the evaporator and a corresponding saturation pressure of the refrigerant entering the evaporator. The controller is configured to determine a position of an electronic expansion valve of the cooling module. The electronic expansion valve is configured to meter mass flow of refrigerant into the evaporator based on needed mass flow, valve flow characteristics and/or pressure differential between refrigerant supply pressure and anticipated evaporating pressure.

The controller of the cooling module further includes a PID loop that regulates the electronic evaporator pressure regulating valve position as needed to maintain a predetermined saturated evaporating temperature. The sensor package obtains information so that the controller establishes a dew point temperature of water vapor contained within the air to be cooled. The controller is further configured to establish a necessary bias between evaporating temperature of the evaporator and a dew point temperature of water vapor contained with the air to be cooled to prevent the formation of condensate on the evaporator. The controller is configured to reconcile differences between water vapor dew point temperature and evaporating temperature needed to achieve desired leaving temperature of cooled air from the evaporator in such a manner as to achieve desired supply air temperature of cooled air so long as condensation does not form on the evaporator. In addition, the controller is configured to allow multiple groups of evaporators of cooling modules to share a common communications network while enabling an association of evaporators to specific groups of cooling modules to aggregate and synchronize with other members of the same group.

In certain embodiments, methods are disclosed for controlling the load dynamics of a PRCS used in a HA/CA configuration and in a HACS configuration. Specifically, methods directed to controlling air flow within a cooling unit based on the information obtained from the flow of refrigerant or coolant through the cooling unit. Depending on the configuration, one of two control algorithms may be used. One algorithm is disclosed for the HA/CA configuration and another algorithm is disclosed for the HACS configuration.

Referring now to the drawings, and more particularly to FIG. 1, an exemplary pumped refrigerant cooling system or PRCS is generally designated at 10. The pumped refrigerant cooling system 10 is connected to a source of chilled water 12 by a supply line 14. Heated water is returned to the source 12 from the pumped refrigerant cooling system 10 by a return line 16. The system 10 includes a refrigerant distribution unit 18, which is configured to pump liquid refrigerant (e.g., $CO_2$, R-134a, R-407c and R-410a) by a liquid supply line to several cooling modules, each indicated at 22. Although six cooling modules 22 are illustrated in FIG. 1, it should be understood that any number of cooling modules 22 may be provided as part of pumped refrigerant cooling system 10 or a dedicated subsystem. Heated refrigerant is returned to the distribution unit 18 in a vapor state from the cooling modules 22 by a vapor return line 24.

The cooling modules 22 may be positioned above a hot aisle for a hot aisle containment system or HACS configuration or alternately can be placed adjacent to the equipment racks (not shown in FIG. 1) for either the HACS or HA/CA configurations in the manner described above. The cooling modules 22 are configured to receive chilled refrigerant from the distribution unit 18 by the liquid refrigerant supply line 20 to transfer the heat from the loads (e.g., heat produced by the equipment racks), each indicated at 26, into the refrigerant by an evaporator (not shown in FIG. 1) provided within each cooling module 22. The operation of each cooling module 22 will be described in greater detail below with reference to FIGS. 2 and 3. During this process, the refrigerant undergoes a phase change from a liquid to a vapor state. The vaporized refrigerant is returned to the distribution unit 18 by the vapor refrigerant return line 24.

Still referring to FIG. 1, the pumped refrigerant cooling system 10 further includes a number of environmental sensors, each indicated at 28. The environmental sensors 28 may be configured to provide temperature and humidity data, which is used to monitor the ambient air temperature of the heat loads 26, and to compute the dew point of the environment in which the cooling modules 22 operate. The system 10 further includes a communication network 30, which provides a physical medium that the distribution unit 18, cooling modules 22, and sensors 28 use to communicate with each other.

Figure 2:
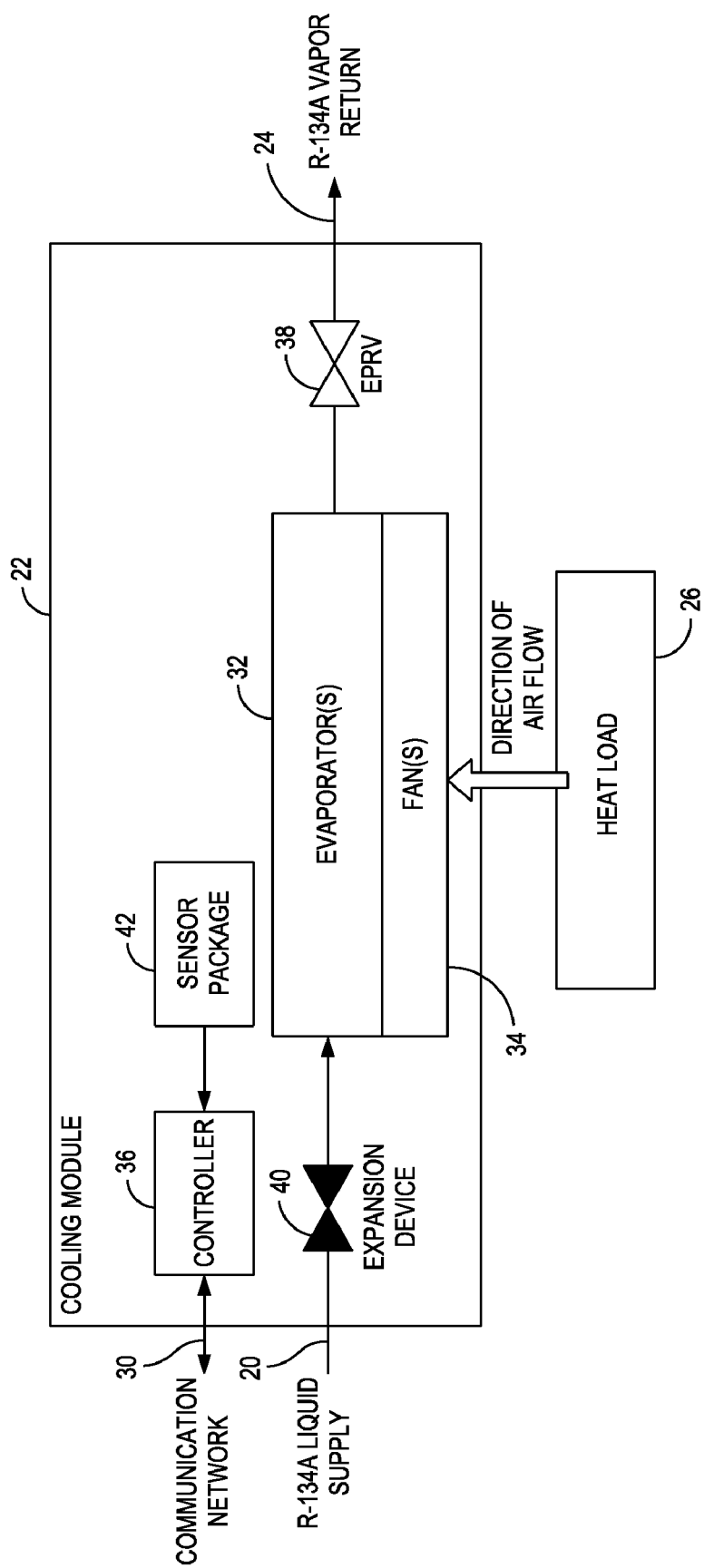
FIG. 2 is a block diagram of a cooling module of the cooling system shown in FIG. 1.

Turning now to FIG. 2, each cooling module 22 includes an evaporator 32, which is used to transfer heat from the IT equipment (not shown in FIG. 2) to the refrigerant travelling through the evaporator, and one or more fans 34, which are used to provide air flow across the evaporator. As shown, the fans 34 are configured to direct the heat load 26 (from the IT equipment contained within the equipment racks) toward the evaporator 32 for vaporizing refrigerant provided within the evaporator. A controller 36 is provided to control the operation of the cooling module 22. Specifically, in one embodiment, the controller 36 is a microprocessor-based device that is responsible for executing the operation, including the control algorithms described herein, of the cooling module 22. In other embodiments, the controller may be part of a master controller provided within the system 10 that communicates with the master controller on the communication network 30.

Each cooling module 22 further includes an evaporator pressure regulator valve 38, which is used to control the saturation temperature of the refrigerant traveling through the evaporator 32, and an electronic expansion valve 40, which is used to maintain the proper super heat temperature at the exiting port of the evaporator. The cooling module 22 is further provided with a sensor package 42, which, in one embodiment, may include one or more of the following sensors: fan tachometers; return air thermometers; supply air thermometers; evaporator pressure sensors; and rack inlet thermometers. In other embodiments, the sensor package may form part of the sensors 28 described in reference to system 10. As shown, the sensor package 42 communicates with the controller 36 to provide continuous feedback to the controller on the operational parameters of the cooling module 22. Based on the information obtained by the sensor package 42, the operation of the cooling module 22 may be controlled in the manner described below.

In certain embodiments, each fan 34 is equipped with a tachometer (part of sensor package 42) that measures the speed of the fan. A separate control that is described below may be provided for controlling the speed of the fan. A return air thermometer (part of sensor package 42) measures the temperature of the air drawn into the evaporator 32. Some embodiments may include providing several thermometers (part of sensor package 42), which are evenly distributed on the evaporator 32. The controller 36 is configured to use the average of these sensors as the return air temperature. The supply air thermometers measure the temperature of the air after it has passed through the evaporator 32. Some embodiments may include providing several sensors (part of sensor package 42), which are evenly distributed on the evaporator 22. As with the return air thermometers, the controller 36 is configured to use the average of these sensors as the supply air temperature. An evaporator pressure sensor (part of sensor package 42) measures the refrigerant pressure at the point where the refrigerant exits the evaporator 32. One or more rack inlet thermometer (part of sensor package 42) measures the temperature of IT equipment at the point where the equipment draws cool air.

The controller 36 may be configured to shut off the operation of the fans 34 to prevent hot air from being exhausted by the cooling module 22 in the case of a cooling system failure.

Figure 3:
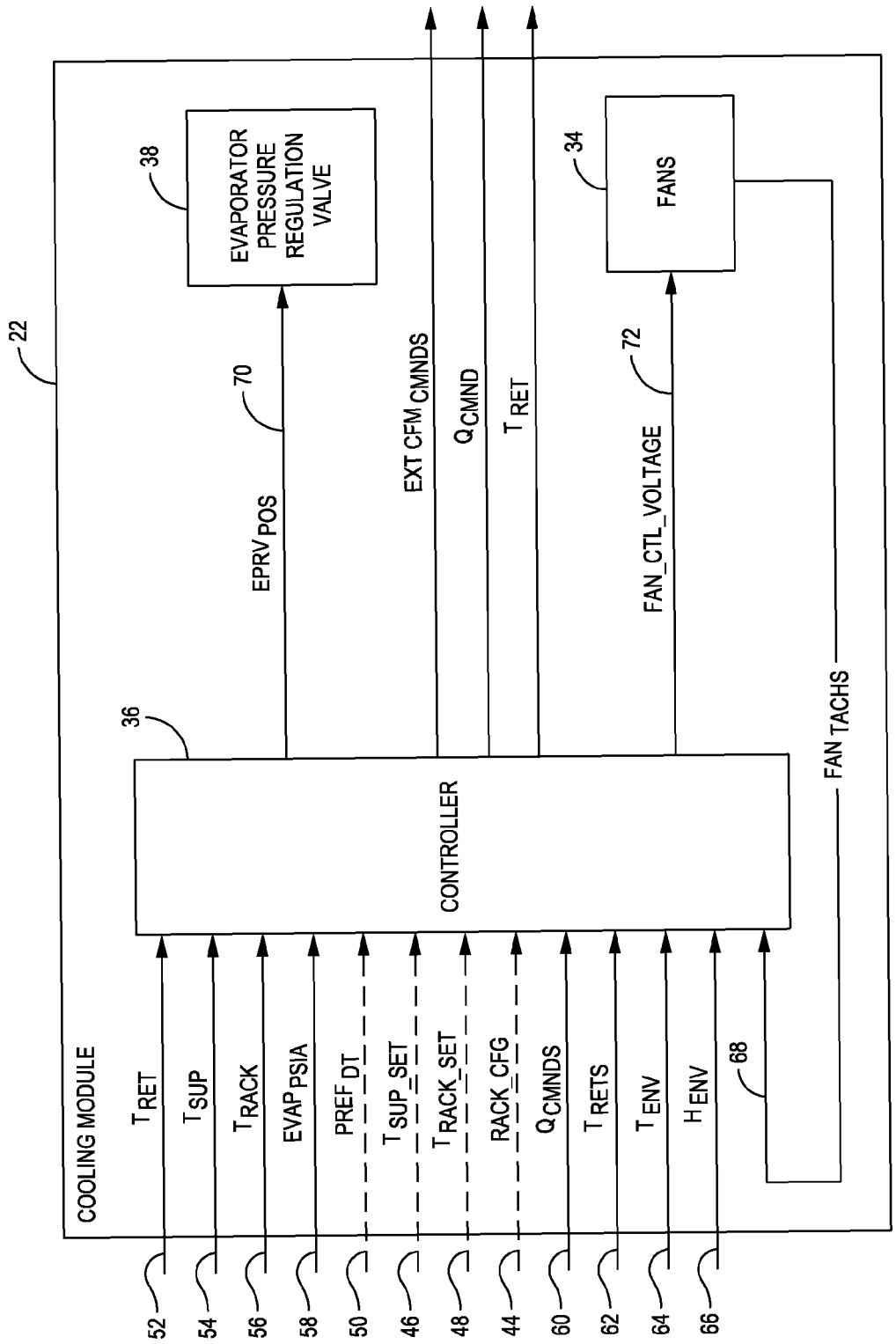
FIG. 3 is a block diagram of a control used to operate the cooling module.

In FIG. 3, a block diagram of the cooling module control architecture is shown. It should be noted that prior to utilizing the pumped refrigerant cooling system 10, the user or operator must configure the controller 36 by selecting which control algorithm (described below) to use based on the configuration of the data center. The selection of the particular configuration is shown at 44 in FIG. 3. If the HA/CA configuration is selected, then the user must select a desired supply air temperature set point at 46 and a rack inlet temperature set point at 48. If the user selects the HACS configuration, then the user must select a desired supply air temperature set point at 46 and a desired temperature rise across the IT equipment at 50.

As shown in FIG. 3, beyond the user inputs 44, 46, 48 and 50, the controller 52 is further configured to receive and process information taken from the cooling module 22 and/or pumped refrigerant cooling system 10. Such information may include the following information taken from the sensor package: return air temperature 52; supply air temperature 54; rack inlet temperature 56; evaporator pressure 58; cooling capacity demand 60; return supply air temperature 62; environmental considerations 64, 66; and fan speed 68. The controller 36 is configured to perform a continuous cycle of accepting inputs from the sensors 28 and the sensor package 42 and from the controllers 36 of other cooling modules 22. Based on this information, the controller 36 adjusts the position of the evaporator pressure regulation valve 38 indicated by arrow 70 and the speed of the fans 34 indicated by arrow 72 as required to maintain a predetermined rack inlet temperature and air flow to the IT equipment.

Figure 4:
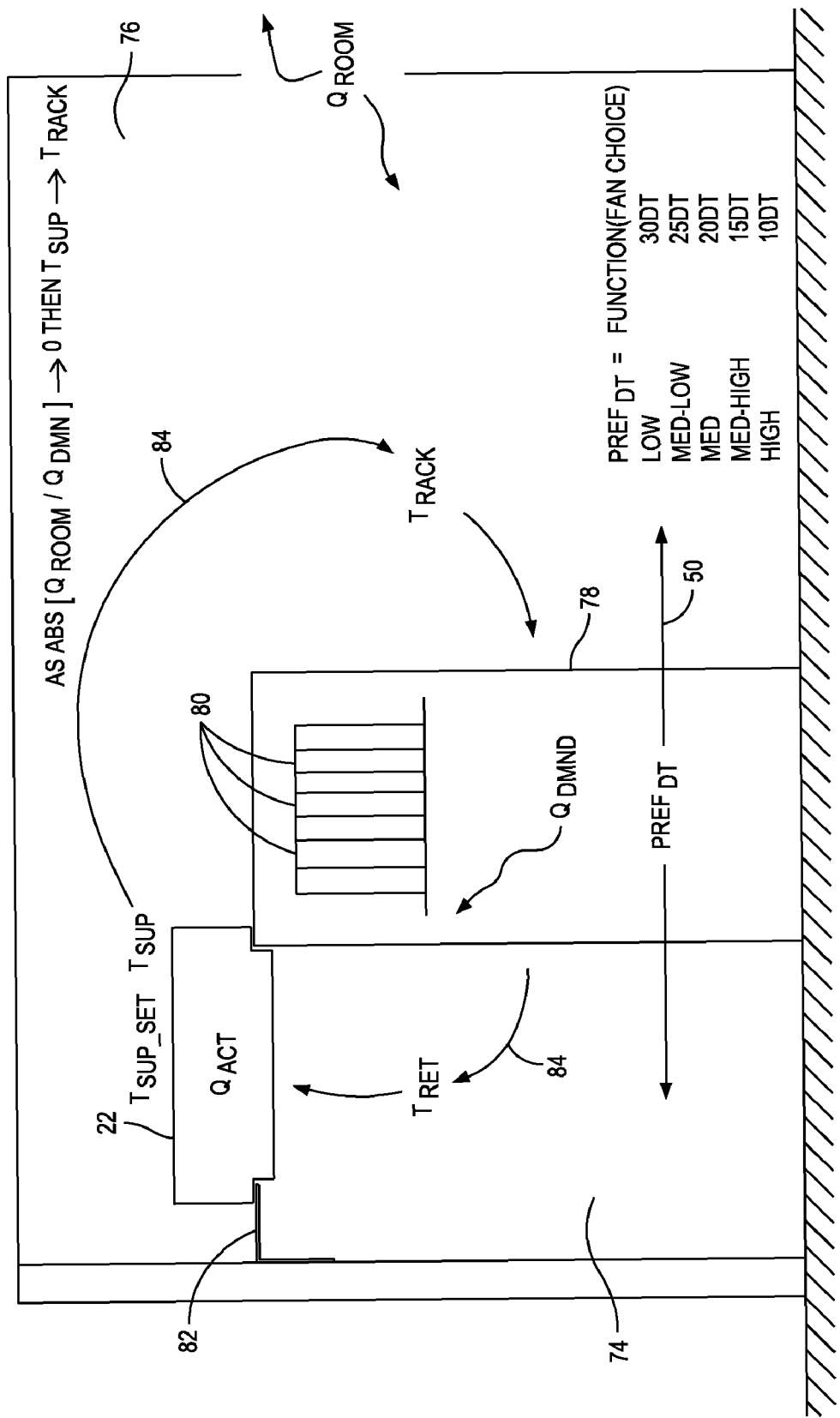
FIG. 4 is a diagram showing control strategy of the cooling system.

In a HACS environment, in one embodiment, the configuration consists of one or more cooling modules 22 positioned above a hot aisle 74 (or distributed among the equipment racks) in a data center 76. FIG. 4 illustrates an exemplary overhead configuration having an equipment rack 78 and a cooling module 22, although this control strategy applies to the other configuration as well. The equipment rack 74 is configured to house IT or other types of electronic equipment, each indicated at 80. The combination of cooling modules 22 along with one or more ceiling panels 82 and doors (not shown) creates an enclosed hot aisle vestibule. The enclosed vestibule allows only one principal air re-circulation path, which is illustrated by arrow 84. As shown, hot air generated by the equipment rack 78 travels through the cooling module 22, which is located above the hot aisle 74. The hot air is treated and cooled by the cooling module 22 and travels within the data center 76 back to the front of the equipment rack 78. The surrounding environmental space is maintained more or less at a neutral enthalpy state to a predetermined supply air temperature set point. As a result, the supply air temperature approaches the rack inlet temperature. Air circulates back to the fronts of the equipment racks 78 where it is heated by the electronic equipment 80 contained within the equipment racks. As shown, the preferred or desired temperature differential 50 may be set by the operator of the system 10 or may be calculated by the controller 36 based on information taken from the data center 76. In one embodiment, a preferred temperature is 68° F. Obviously, other temperatures, depending on the requirements as dictated by the electronic equipment housed within the data center 76, may be selected.

Figure 5A:
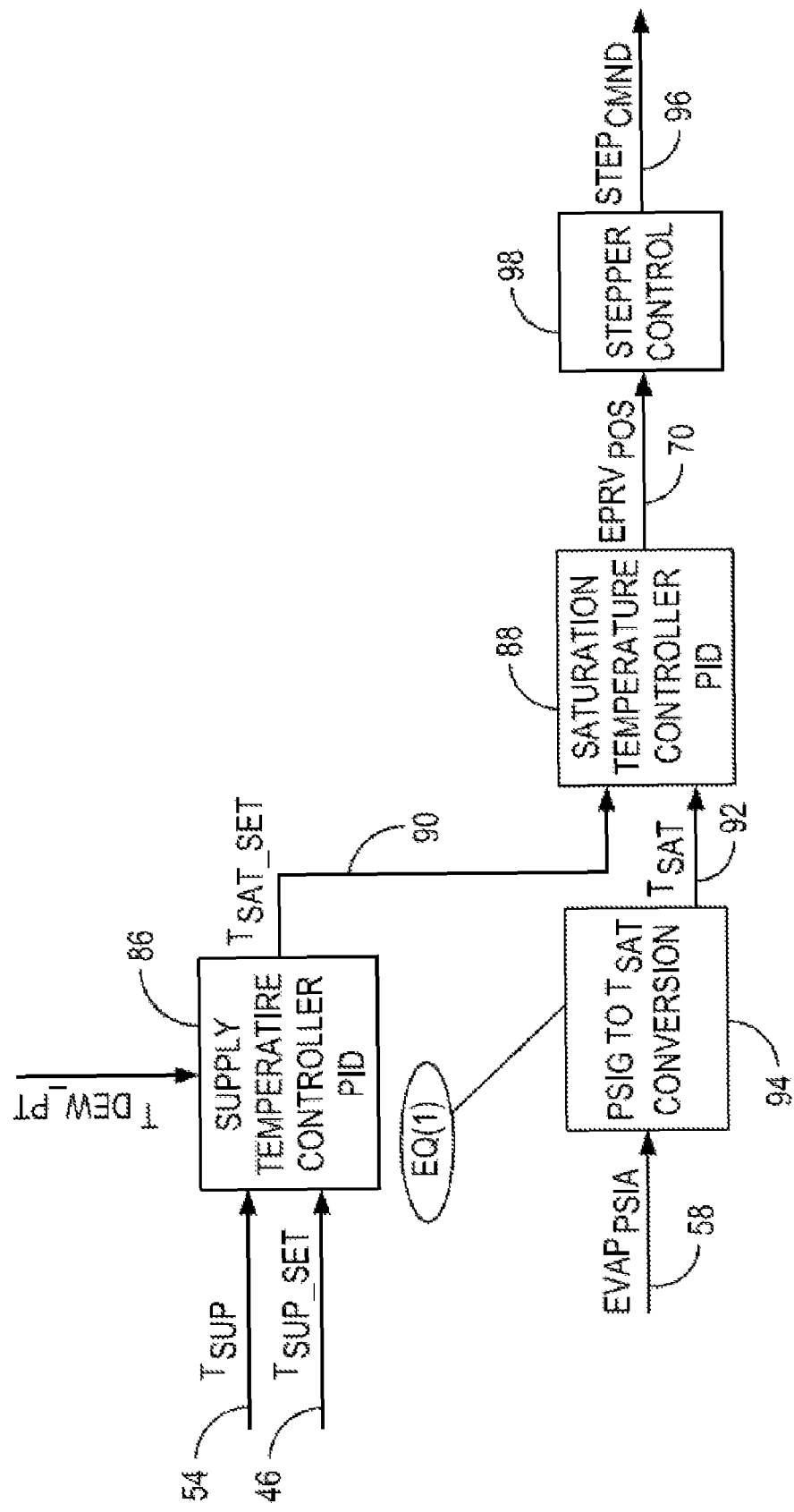
FIG. 5A is a block diagram of a control algorithm used for a hot aisle containment system.
Figure 5B:
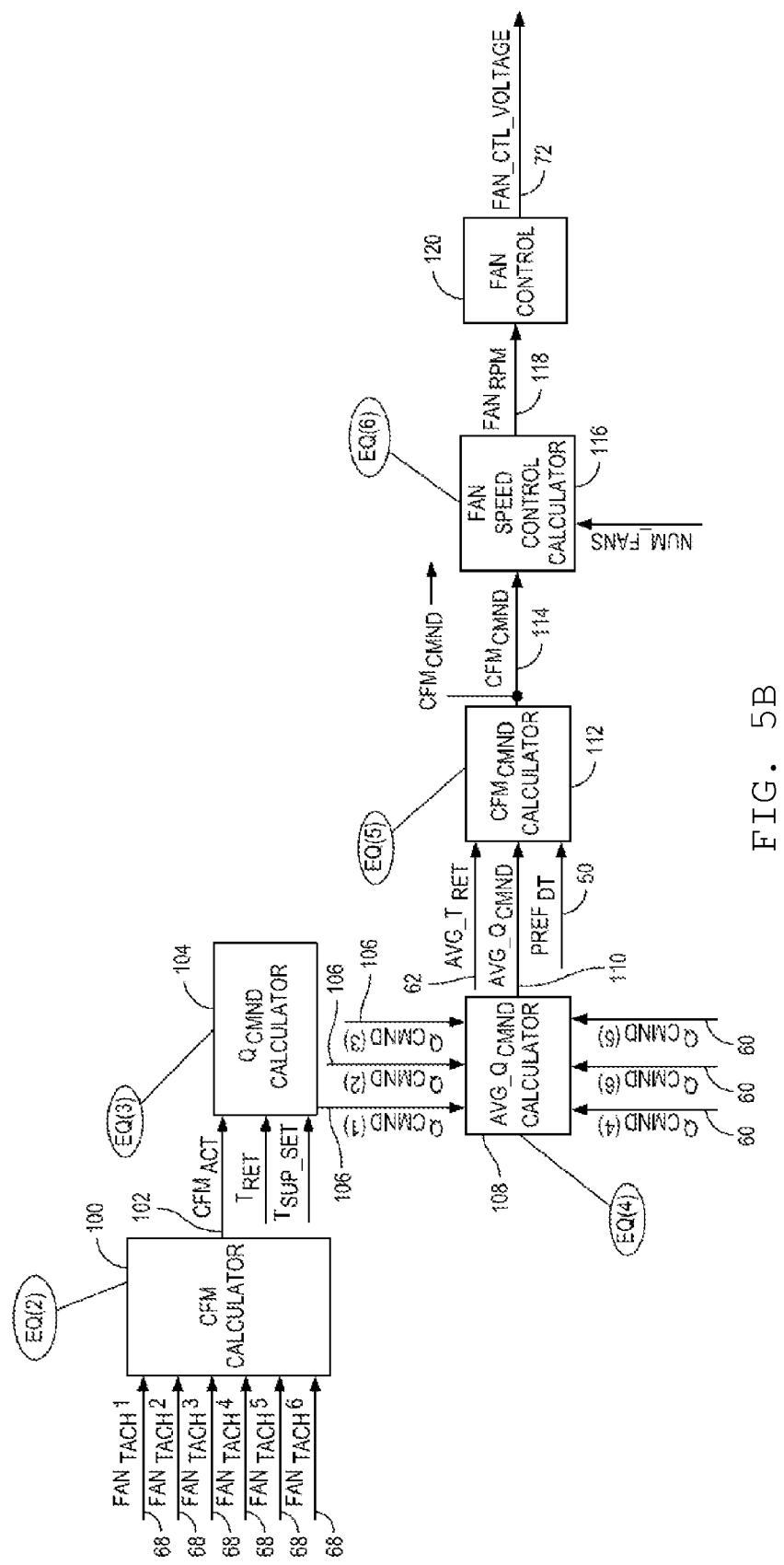
FIG. 5B is a block diagram of a control algorithm used for a hot aisle containment system.

Referring to FIGS. 5A-5B, which illustrate a control strategy of the pumped refrigerant cooling system 10 when used in a hot aisle containment system configuration, the control strategy consists of controlling operation of the system by use of a supply air temperature controller proportional integral derivative ("PID") loop 86 and a saturation temperature 25 controller PID loop 88, and assorted computation blocks. As described previously, the strategy consists of two components. One component is to maintain a constant supply air temperature entering the equipment racks. Another component is to maintain a constant temperature differential across the IT equipment housed by the equipment racks as defined by the space within the hot aisle and the cold aisle. The details of this strategy will be described 30 as follows.

With continued reference to FIGS. 5A-5B, the process of maintaining a constant supply air temperature is performed by the supply air temperature controller PID loop 86 and the saturation temperature controller PID loop 88. Specifically, the supply air temperature controller PID loop 86 is responsible for eliminating an error between the supply air temperature set point 46 and the supply air temperature 54 as read by one or more sensor. The PID loop 86 accomplishes this function by adjusting a saturation temperature set point 90. As the supply air temperature 54 increases above the supply air temperature set point 46, the saturation temperature set point 90 is reduced. Conversely, as the supply 5 air temperature 54 decreases below the supply air temperature set point 46, the saturation temperature set point 90 is increased. In addition, the supply air temperature controller PID loop 86 constrains the saturation temperature set point 90 in such a manner that the saturation temperature set point is always above a dew point of the environment and less then the supply 10 air temperature set point 46. This ensures that condensation will never form on the evaporator 32 of the cooling module 22 and that the evaporator will not become a heater.

The saturation temperature controller PID loop 88 is responsible for eliminating an error that occurs between the saturation temperature set point 90 and the saturation temperature 92 of the refrigerant leaving the evaporator. The saturation temperature 92 is computed by a conversion block 94 from the evaporation pressure 58 of the refrigerant leaving the evaporator 32 by using Equation 1.

$$T_{SAT} = 3 \times 10^{-5} \times EVAP_{PSIA}^3 - 0.0097 \times EVAP_{PSIA}^2 + 1.5813 \times EVAP_{PSIA} - 47709 \quad (1)$$

where $T_{SAT}$—saturation temperature; and
$EVAP_{PSIA}$—evaporator pressure.

The saturation temperature controller PID loop 88 eliminates the error by adjusting an opening of the evaporator pressure regulator valve 38, which is converted to a series of stepper motor commands 96 via a stepper control at block 98. As the saturation temperature 92 increases above the saturation temperature set point 90, the evaporator pressure regulator valve 38 is opened by the stepper command signal 96, thus causing the saturation temperature to drop. This drop increases the cooling capacity of the evaporator 32. As the saturation temperature 92 decreases below the saturation temperature set point 90, the evaporator pressure regulator valve 38 is closed by the stepper command signal 96. Thus, a constant supply air temperature may be maintained by this process.

The process of maintaining a constant temperature differential across the IT equipment is performed by adjusting the air flow through the IT equipment as the heat dissipated by the IT loads changes. Still referring to FIGS. 5A-5B, the process begins by calculating air flow with a CFM calculator 100, which estimates an actual air flow 102 that the cooling module fans 34 are supplying by measuring the speed of each fan at 68 in the cooling module 22 and applying a linear transformation, which is identified in Equation 2.

$$CFM_{ACT} = \frac{450}{2000} \sum_{M=1}^{F} FAN_{TACH_M} \quad (2)$$

where
F—is the number of fans in the cooling module (tachometer reading);
$FAN_{TACH\,M}$—revolutions per minute of a fan M; and
$CFM_{ACT}$—actual air flow in cubic feet per minute.

This result 102 is then passed to the cooling capacity demand calculator 104, which applies Equation 3 to compute the required cooling capacity demand 106 to realize a desired temperature differential.

$$Q_{CMND} = \frac{CFM_{ACT} \times (T_{RET} \times -0.00194 + 1.2204)(T_{RET} - T_{SUP\_SET}) \times}{3415.2} \quad (3)$$

where
$Q_{CMND}$—cooling capacity demand (kW);
$T_{RET}$—return air temperature;
$T_{SUP\_SET}$—supply air temperature set point; and
$CFM_{ACT}$—actual air flow in cubic feet per minute.

This information is then passed from each cooling module 22 to the other cooling modules 22 that have been designated by a group controller. The group controller (e.g., controller 36) accumulates cooling capacity demand from all of the cooling modules 22 provided within the system 10, and then an average cooling capacity demand calculator 108 calculates an average cooling capacity demand 110 by using Equation 4.

$$AVG\_Q_{CMND} = \frac{1}{N} \sum_{M=1}^{N} Q_{CMND_N} \quad (4)$$

where
N—the number of cooling modules in the PRCS;
$Q_{CMND_N}$—cooling capacity demand for cooling module M (kW); and
$AVG\_Q_{CMND}$—average cooling capacity demand for cooling modules (kW).

The average cooling capacity demand 110 is then passed to the group controller's desired air flow calculator 112, which uses Equation 5 to calculate a desired air flow 114 in cubic feet per minute.

$$CFM_{CMND} = \frac{3415.2 \times AVG\_Q_{CMND}}{PREF_{DT} \times (AVG\_T_{RET} \times (-0.00194 + 1.2204)} \quad (5)$$

where
$PREF_{DT}$—desired temperature differential across the IT equipment;
$AVG\_T_{RET}$—average return air temperature; and
$CFM_{CMND}$—desired air flow in cubic feet per minute.

The desired air flow 114 is then sent to a fan speed control calculator 116 for all of the cooling modules 22 within the system 10. The fan speed control calculator 116 transforms the desired air flow 114 to the required fan speed 118 for each fan, which is represented in Equation 6.

$$FAN_{RPM} = \frac{2000 \times CFM_{CMND}}{450 \times NUM\_FANS} \quad (6)$$

where NUM_FANS—number of working fans in the cooling module; and
$FAN_{RPM}$—required RPM of a single fan.

The required fan speed 118 is then translated to an analog signal 72 via a fan control process shown in block 120, which applies analog signals to all of the fans 34 of the cooling module 22. It should be understood that the fans 34 may be configured to respond to changes in the desired air flow faster than the return air temperature. As such, sufficient time must be allowed after a new desired air flow input to allow the return air temperature to respond. Otherwise, the system may become unstable.

The HA/CA configuration may be organized such that the cold air is contained in front of the equipment racks containing the IT equipment and the hot air generated by the IT equipment is exhausted into a hot aisle on the other side of the equipment racks. One or more cooling modules are distributed among the equipment racks in the manner described above. The cooling modules are configured to draw in the air from the hot aisle, remove the heat, and exhaust conditioned air into the cold aisle.

Figure 6A:
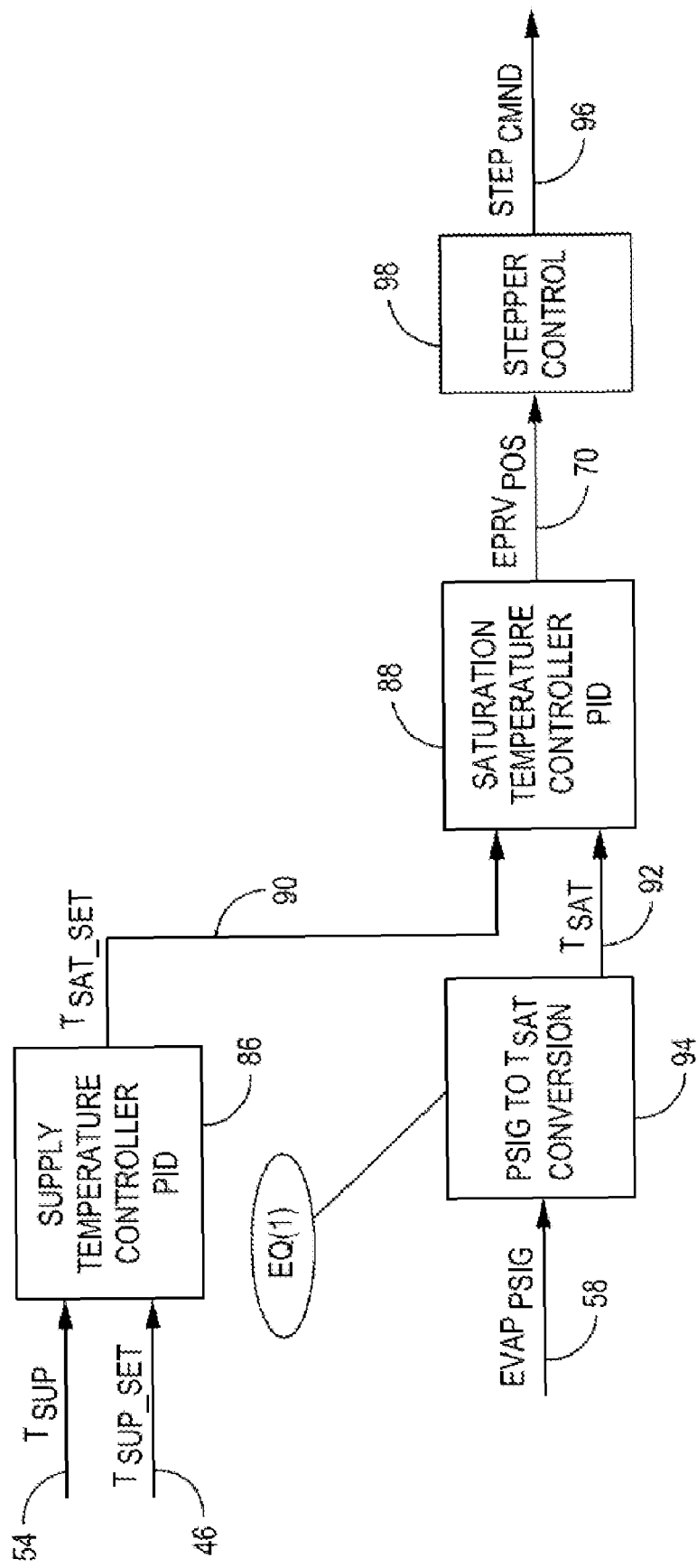
FIG. 6A is a block diagram of a control algorithm used for a hot aisle/cold aisle system.
Figure 6B:
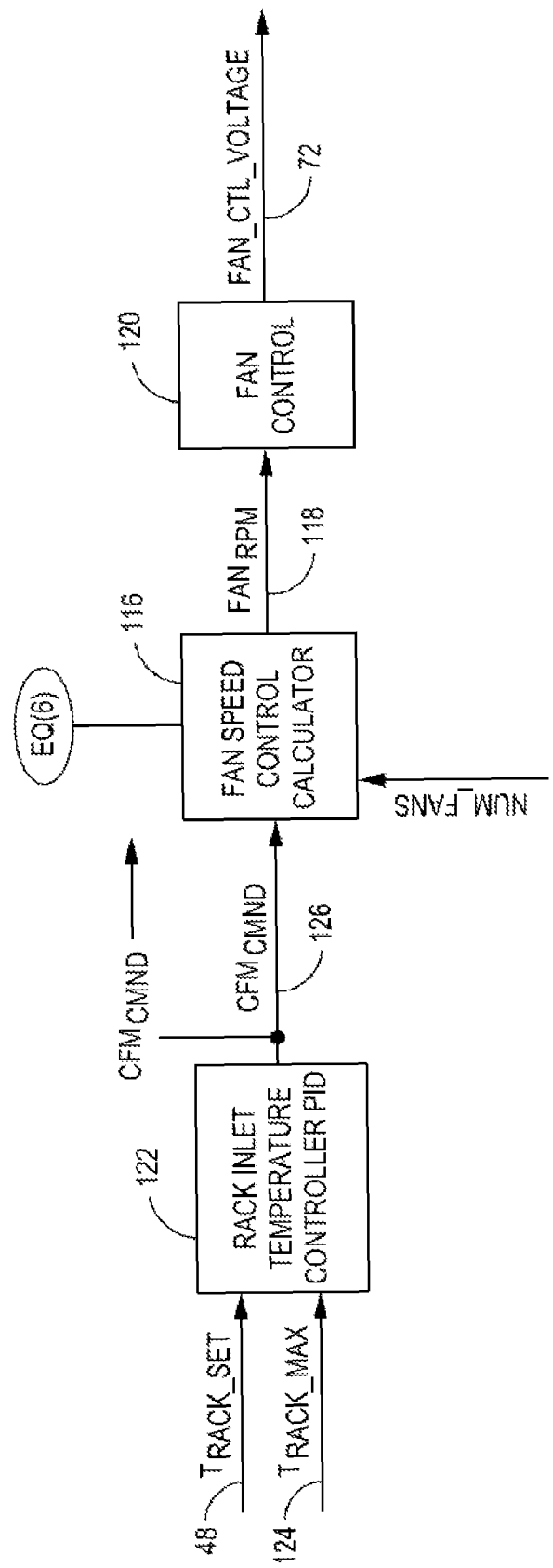
FIG. 6B is a block diagram of a control algorithm used for hot aisle/cold aisle system.

Referring to FIGS. 6A-6B, with the HA/CA configuration, the control strategy is to maintain a constant supply air temperature and utilize the fans 34 of the cooling 5 modules 22 to maintain a constant rack inlet temperature. Essentially, maintaining a constant supply air temperature is the same process as described in the process of maintaining a constant supply air temperature with reference to the HACS configuration. This process is shown in FIGS. 6A-6B.

When maintaining a constant rack inlet air temperature, the process is performed by a rack inlet temperature controller PID loop 122, which executes only on the group controller. The rack inlet temperature controller PID loop 122 is responsible for eliminating any error between the rack inlet temperature set point 48 and the maximum rack inlet temperature 124 measured within a group of cooling modules 22. This process is accomplished by adjusting the air flow 126 of the cooling modules 22. As the maximum rack inlet temperature 124 increases above the rack inlet temperature set point 48, the air flow 126 will increase. As the maximum rack inlet temperature 124 decreases below rack inlet temperature set point 48, the air flow 126 will decrease.

The adjusted air flow value is then sent to the fan speed control calculator 116 for all of cooling modules 22, which transforms the desired air flow to the required fan speed for each fan 34. The fan speed 118 is then translated to an analog signal 72 by the fan control process 120, which applies analog signals to all of the fans 34 provided in the cooling module 22. It should be understood that the fans 34 will respond faster to changes in the desired air flow 126 than to changes in the return air temperature. As such, sufficient time must be allowed after a new desired air flow 126 to allow the return air temperature to respond. Otherwise, the system will become unstable.

Thus it should be observed that the controller 36 of embodiments of the present disclosure is configured to manipulate the flow of refrigerant entering the evaporator 32 by controlling the operation of the expansion valve 40. The arrangement is such that the controller 36 manipulates the expansion valve 40 to regulate refrigerant mass flow to the evaporator 32 so that the refrigerant mass flow coincides with a thermal demand of the evaporator to assure complete evaporation of the refrigerant before exiting the evaporator. The sensor package 42 may be configured to include a pressure sensor, which is located immediately before the expansion valve 40. The sensor package 42 may be further configured to include a pressure sensor positioned within the evaporator 32 to sense the pressure of evaporating refrigerant within the evaporator. In particular embodiments, the controller 36 is configured to calculate cooling demand of the evaporator 32 of the cooling module 22 to establish a refrigerant mass flow requirement to support a needed cooling demand of the evaporator.

In addition, the controller 36 is configured to anticipate an evaporating temperature necessary to satisfy a desired cooled air temperature leaving the evaporator 22 and a corresponding saturation pressure of the refrigerant entering the evaporator. This is achieved by the controller 36 determining and maintaining a position of the electronic expansion valve 40, which meters mass flow of refrigerant into the evaporator 32 based on needed mass flow, valve flow characteristics and/or a pressure differential between refrigerant supply pressure and anticipated evaporating pressure. In order to maintain a constant supply air temperature, the PID loop 86 of the controller 36 regulates the opening of the electronic evaporator pressure regulating valve 38 as needed to maintain a predetermined saturated evaporating temperature 90. The sensor package 42 obtains information so that the controller 36 establishes a dew point temperature of water vapor contained within the air to be cooled. The controller 36 is configured to establish a necessary bias between evaporating temperature of the evaporator 32 and a dew point temperature of water vapor contained within the air to be cooled to prevent the formation of condensate on the evaporator. The controller 36 is further configured to reconcile differences between water vapor dew point temperature and evaporating temperature needed to achieve a desired leaving temperature of cooled air from the evaporator 32 in such a manner as to achieve desired supply air temperature 46 of cooled air so long as condensation does not form on the evaporator 32.

In certain embodiments, the controller 36 is configured to allow multiple groups of evaporators 32 of cooling modules 22 to share a common communications network 30 while enabling an association of evaporators to specific groups of cooling modules to aggregate and synchronize with other members of the same group. The communication network 30 communicates with a plurality of evaporators 32 of cooling modules 22 to enable in each cooling module an aggregation of collective total cooling demand and equal sharing of the cooling demand across the various member evaporators of the particular communications network.

Various methods of controlling the load dynamics of the pumped refrigerant cooling system 10 may also be achieved. In one embodiment, the method includes determining a configuration of the one or more rows of equipment racks 78 within the data center 76, maintaining a constant supply air temperature 54 for air entering into the equipment racks within the one or more rows of equipment racks, and maintaining a constant temperature differential 50 between the supply air temperature and air entering one or more cooling modules 22 of the pumped refrigerant cooling system 10. The act of maintaining a constant supply air temperature 54 may include obtaining a supply air temperature measurement of air entering the equipment rack 78 and controlling the supply air temperature 54. The act of maintaining a constant temperature differential 50 may include estimating an actual air flow within the cooling module 22 and controlling the fans 34 of the cooling module based on a required cooling capacity 114 used to obtain the constant temperature differential.

Other embodiments of the method may include manipulating a flow of refrigerant entering an evaporator 32 of the cooling module 22 by controlling the operation of the expansion valve 40 so that a refrigerant mass flow coincides with a thermal demand of the evaporator so as to assure complete evaporation of refrigerant before exiting the evaporator. The method may further include calculating cooling demand of the evaporator 32 of the cooling module 22 and establishing a refrigerant mass flow requirement to support a needed cooling demand of the evaporator. The method may also calculate an evaporating temperature necessary to satisfy a desired cooled air temperature leaving the evaporator 32 of the cooling module 22 and a corresponding saturation pressure of the refrigerant entering the evaporator. This may be achieved by determining a position of the electronic expansion valve 38 of the cooling module 22, with the electronic expansion valve being configured to meter mass flow of refrigerant into the evaporator 32 based on needed mass flow, valve flow characteristics and/or pressure differential between refrigerant supply pressure and anticipated evaporating pressure.

The method may also include regulating the electronic evaporator pressure regulating valve 38 as needed to maintain a predetermined saturated evaporating temperature 90. In certain embodiments, the method may calculate a necessary bias between an evaporating temperature of the evaporator 32 of the cooling module 22 and a dew point temperature of water vapor contained within the air to be cooled to prevent the formation of condensate on the evaporator. Differences between water vapor dew point temperature and evaporating temperature needed to achieve a desired leaving temperature of cooled air from the evaporator 32 of the cooling module 22 may be reconciled in such a manner as to achieve a desired supply air temperature of cooled air so long as condensation does not form on the evaporator.

Thus, the methods and apparatus disclosed herein are designed to automatically adjust a cooling capacity of a pumped refrigerant cooling system so that the cooling capacity matches and sufficiently addresses heat generated by a heat load, e.g., heat generated by IT equipment. The methods and apparatus are designed to prevent overcooling within a data center environment, while providing added benefits, such as minimizing fan noise. The methods and apparatus are designed to maintain the IT equipment at a constant temperature while utilizing only the energy required to remove heat dissipated by the heat load generated by the IT equipment. Thus, only the energy needed to neutralize the heat load is required. In certain embodiments, the controller may be configured to shut off fans within the cooling modules to prevent hot air from being exhausted into the data center environment.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A pumped refrigerant cooling system for use in a row of equipment racks configured to contain electronic equipment, the pumped refrigerant cooling system comprising:
   a communication network;
   a refrigerant distribution unit in fluid communication with a chilled refrigerant supply and a heated refrigerant return, the refrigerant distribution unit being coupled to the communication network;
   at least one cooling module in fluid communication with the refrigerant distribution unit by a supply line and a return line, the cooling module being coupled to the communication network, the cooling module including an evaporator and at least one fan configured to direct air over the evaporator;
   a sensor package coupled to the communication network, the sensor package being configured to monitor temperature and pressure reference points provided in the pumped refrigerant cooling system and the equipment racks; and
   a controller forming part of the cooling module and coupled to the communication network and the sensor package, the controller, based on information obtained from the sensor package, being configured to manipulate the flow of refrigerant through the evaporator by controlling the delivery of refrigerant to the evaporator and being configured to manipulate the flow of air over the evaporator by controlling the speed of the fan.

2. The pumped refrigerant cooling system of claim 1, wherein the cooling module further includes a pressure regulating valve disposed in the return line between the evaporator and the refrigerant distribution unit.

3. The pumped refrigerant cooling system of claim 2, wherein the sensor package is configured to obtain information directed to a saturation temperature, and wherein the controller, based on the information directed to the saturation temperature, is configured to open and close the pressure regulating valve to achieve a preset saturation temperature of the cooling module.

4. The pumped refrigerant cooling system of claim 1, wherein the cooling module further includes an expansion valve disposed in the supply line between refrigerant distribution unit and the evaporator, the expansion valve being configured to meter mass flow of refrigerant into the evaporator.

5. The pumped refrigerant cooling system of claim 4, wherein the controller is configured to manipulate the flow of refrigerant entering the evaporator by controlling the operation of the expansion valve, the arrangement being such that the controller manipulates the expansion valve to regulate refrigerant mass flow to the evaporator so that the refrigerant mass flow coincides with a thermal demand of the evaporator to assure complete evaporation of the refrigerant before exiting the evaporator.

6. The pumped refrigerant cooling system of claim 5, wherein the sensor package includes a pressure sensor located immediately before the expansion valve and a pressure sensor positioned to sense the pressure of evaporating refrigerant within the evaporator.

7. The pumped refrigerant cooling system of claim 1, wherein the controller is configured to calculate cooling demand of the evaporator of the cooling module and established a refrigerant mass flow requirement to support a needed cooling demand of the evaporator.

8. The pumped refrigerant cooling system of claim 1, wherein the controller is configured to anticipate an evaporating temperature necessary to satisfy a desired cooled air temperature leaving the evaporator and a corresponding saturation pressure of the refrigerant entering within the evaporator.

9. The pumped refrigerant cooling system of claim 1, wherein the controller is configured to determine a position of an electronic expansion valve of the cooling module, the electronic expansion valve being disposed in the supply line between refrigerant distribution unit and the evaporator, the electronic expansion valve being configured to meter mass flow of refrigerant into the evaporator based on needed mass flow, valve flow characteristics and/or a pressure differential between refrigerant supply pressure and anticipated evaporating pressure.

10. The pumped refrigerant cooling system of claim 1, wherein the cooling module further includes an electronic evaporator pressure regulating valve disposed in the return line between the evaporator and the refrigerant distribution unit, the electronic evaporator pressure regulating valve being configured to regulate evaporator pressure to maintain a desired cooled air exit temperature from evaporator.

11. The pumped refrigerant cooling system of claim 10, wherein the controller of the cooling module further includes a PID loop that regulates the electronic evaporator pressure regulating valve position as needed to maintain a predetermined saturated evaporating temperature.

12. The pumped refrigerant cooling system of claim 1, wherein the controller is configured to allow multiple groups of evaporators of cooling modules to share a common communications network while enabling an association of evaporators to specific groups of cooling modules to aggregate and synchronize with other members of the same group.

13. A method of controlling an operation of a pumped refrigerant cooling system for use in a data center having one or more rows of equipment racks, each equipment rack being configured to contain electronic equipment, the method comprising:
   determining a configuration of the one or more rows of equipment racks within the data center;
   maintaining a constant supply air temperature for air entering into the equipment racks within the one or more rows of equipment racks; and maintaining a constant temperature differential between the supply air temperature and air entering one or more cooling modules of the pumped refrigerant cooling system, wherein maintaining a constant temperature differential includes estimating an actual air flow within the cooling module and controlling at least one fan in the cooling module based on a required cooling capacity used to obtain the constant temperature differential.

14. The method of claim 13, wherein maintaining a constant supply air temperature includes obtaining a supply air temperature of air entering the equipment rack and controlling the supply air temperature.

15. The method of claim 13, further comprising manipulating a flow of refrigerant entering an evaporator of the cooling module by controlling the operation of an expansion valve so that a refrigerant mass flow coincides with a thermal demand of the evaporator so as to assure complete evaporation of refrigerant before exiting the evaporator.

16. The method of claim 13, further comprising calculating cooling demand of an evaporator of the cooling module and establishing a refrigerant mass flow requirement to support a needed cooling demand of the evaporator.

17. The method of claim 13, further comprising calculating an evaporating temperature necessary to satisfy a desired cooled air temperature leaving an evaporator of the cooling module and a corresponding saturation pressure of the refrigerant entering the evaporator of the cooling module.

18. The method of claim 13, further comprising determining a position of an electronic expansion valve of the cooling module, the electronic expansion valve being disposed in a supply line delivering refrigerant to an evaporator of the cooling module, the electronic expansion valve being configured to meter mass flow of refrigerant into the evaporator based on needed mass flow, valve flow characteristics and/or pressure differential between refrigerant supply pressure and anticipated evaporating pressure.

19. The method of claim 13, further comprising regulating an electronic evaporator pressure regulating valve position as needed to maintain a predetermined saturated evaporating temperature.

20. The method of claim 13, further comprising allowing multiple groups of evaporators of cooling modules to share a common communications network while enabling an association of evaporators to specific groups of cooling modules to aggregate and synchronize with other members of the same group.

* * * * *